United States Patent
Merrikh et al.

(10) Patent No.: US 10,224,264 B1
(45) Date of Patent: Mar. 5, 2019

(54) HIGH PERFORMANCE EVAPORATION-CONDENSATION THERMAL SPREADING CHAMBER FOR COMPUTE PACKAGES

(71) Applicant: QUALCOMM Incorporated, San Diego, CA (US)

(72) Inventors: Ali Akbar Merrikh, Austin, TX (US); Mehdi Saeidi, San Diego, CA (US); Guoping Xu, San Diego, CA (US); Damion Gastelum, Escondido, CA (US); Luis Eduardo De Los Heros Beunza, San Diego, CA (US); Ajay Vadakkepatt, San Diego, CA (US); Rama Rao Goruganthu, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/724,283

(22) Filed: Oct. 4, 2017

(51) Int. Cl.
*H01L 23/427* (2006.01)
*H01L 23/04* (2006.01)

(52) U.S. Cl.
CPC ............ *H01L 23/427* (2013.01); *H01L 23/04* (2013.01); *H01L 2224/16* (2013.01); *H01L 2224/16225* (2013.01); *H01L 2224/2929* (2013.01); *H01L 2224/29109* (2013.01); *H01L 2224/73204* (2013.01); *H01L 2224/73253* (2013.01)

(58) Field of Classification Search
CPC ............... H01L 23/427; H01L 23/04; H01L 2224/16225; H01L 2224/29019; H01L 2224/2929
See application file for complete search history.

(56) References Cited

U.S. PATENT DOCUMENTS

| | | | |
|---|---|---|---|
| 8,659,892 B2 | 2/2014 | Yan et al. | |
| 8,970,029 B2 | 3/2015 | Lin et al. | |
| 2004/0036159 A1* | 2/2004 | Bruno | G06F 13/4027 257/703 |
| 2004/0188829 A1* | 9/2004 | Hu | H01L 23/36 257/712 |
| 2008/0237845 A1* | 10/2008 | Kim | G06F 1/203 257/715 |

(Continued)

*Primary Examiner* — Phuc T Dang
(74) *Attorney, Agent, or Firm* — Qualcomm Incorporated

(57) ABSTRACT

Aspects of the disclosure are directed to a package including a substrate, die coupled to the substrate, wick deposited on the die, and an evaporation-condensation chamber having a hollowed bottom and two bottom lips, wherein the wick mates into the hollowed enclosure and substantially merges with the two bottom lips forming a sealed chamber. Other aspects are directed to a method of forming a package including coupling a die to a substrate, depositing a wick on the die, and mating the wick with an evaporation-condensation chamber having a hollowed enclosure and two bottom lips, wherein the mating attaches the wick into the hollowed enclosure and substantially merges the wick with the two bottom lips forming a sealed chamber. By directly depositing the wick over the die and integrating the wick with the encapsulation-condensation chamber, this integrated solution provides significant improvement in package thermal resistance especially for high-power and high-performance applications.

25 Claims, 3 Drawing Sheets

(56) References Cited

U.S. PATENT DOCUMENTS

| | | | |
|---|---|---|---|
| 2010/0128436 A1* | 5/2010 | Edmunds | H01L 23/427 361/700 |
| 2013/0134572 A1* | 5/2013 | Lenniger | H01L 23/367 257/690 |
| 2013/0223010 A1* | 8/2013 | Shioga | H01L 23/13 361/700 |
| 2013/0255921 A1* | 10/2013 | Dai | F28D 15/04 165/104.26 |
| 2015/0144315 A1* | 5/2015 | Chen | F28F 3/12 165/168 |
| 2015/0179617 A1* | 6/2015 | Lin | H01L 23/04 257/713 |
| 2016/0343639 A1* | 11/2016 | Groothuis | F28D 15/043 |
| 2017/0363373 A1* | 12/2017 | Cai | F28F 13/003 |

* cited by examiner

HIGH PERFORMANCE EVAPORATION-CONDENSATION THERMAL SPREADING CHAMBER FOR COMPUTE PACKAGES

BACKGROUND

Field

Aspects of the present disclosure relate generally to thermal management in semiconductor devices and, more particularly, to high performance evaporation-condensation thermal spreading chamber for compute packages.

Background

Performance of semiconductor devices is limited by temperature. Specifically, semiconductor device performance degrades when the internal temperature reaches or exceeds a certain limit. Demands for smaller package sizes and increased component densities have resulted in higher power densities. These demands are further exacerbated in highly integrated semiconductor devices by the occurrence of "hot spots", i.e., localized areas on the chip having relatively high thermal energy generation. Another trend in modern semiconductor devices is the increasing use of higher power consumption circuits, such as in a modern CPU chip. To accommodate more densely packaged and higher power consumption semiconductor devices, conventional high-performance packages typically use a heat spreader or "lid" to spread the heat and lessen the "hot spots". The lid is typically placed between a system on a chip (SoC) and heatsink and is attached to the SoC by a thermal interface material (TIM1) for maintaining good surface-to-surface contact. While interface materials are useful for high-power and high-performance applications, temperature drop across the interface can be significant due to thermal resistance even for best-in-class TIM1 such as solder. As a result, TIM1 is not as effective for lessening "hot spots" for high-power and high-performance applications. Accordingly, there is a need for improving heat dissipation for high-power and high-performance packages.

SUMMARY

The following presents a simplified summary of one or more embodiments to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A semiconductor package according to one aspect is described. The package may include a substrate, a die coupled to the substrate, a wick deposited on the die, and an evaporation-condensation chamber having a hollowed enclosure and two bottom lips, wherein the wick mates into the hollowed enclosure and substantially merges with the two bottom lips forming a sealed chamber.

A method of manufacturing a semiconductor package according to one aspect is described. The method may include forming a package comprising coupling a die to a substrate, depositing a wick on the die, and mating the wick with an evaporation-condensation chamber having a hollowed enclosure and two bottom lips, wherein the mating attaches the wick into the hollowed enclosure and substantially merges the wick with the two bottom lips forming a sealed chamber.

These and other aspects of the invention will become more fully understood upon a review of the detailed description, which follows. Other aspects, features, and embodiments of the invention will become apparent to those of ordinary skill in the art, upon reviewing the following description of specific, exemplary embodiments of the invention in conjunction with the accompanying figures.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
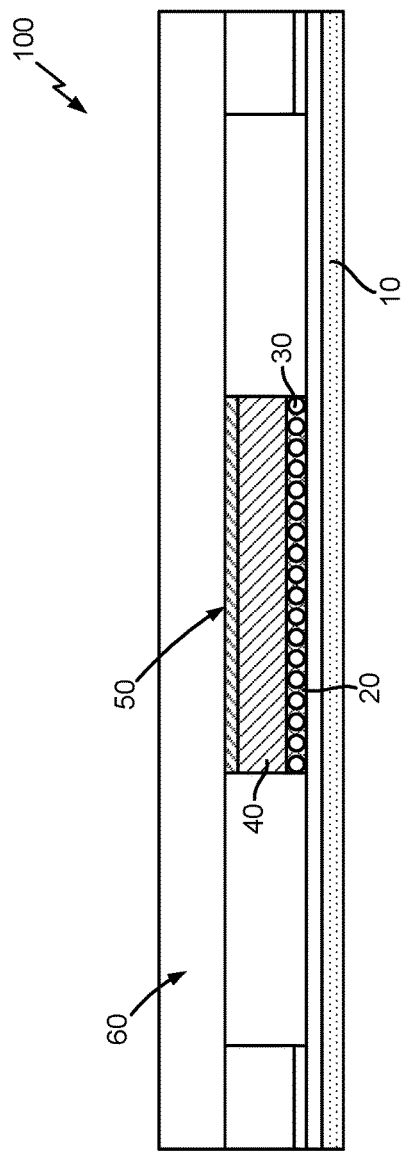
FIG. 1 shows a cross-sectional view of a semiconductor package of the prior art.

FIG. 1 shows a cross-sectional view of a semiconductor package 100 of the prior art. The semiconductor package 100 includes substrate 10, underfill encapsulant 20, solder bumps 30, die 40, a thermal interface material (TIM) 50, and a lid 60. Die 40 is coupled with substrate 10 using joining members such as solder bumps 30. Substrate 10 may include, for example, epoxy resin made from a weave of glass fibers. Substrate 10 may comprise copper for plastic packages that have lead and copper such as Quad Flat No-Lead (QFN) packages where the substrate also operates as a heat spreader. Underfill encapsulant 20 may be filled and sealed in the gap between die 40 and substrate 10. Underfill encapsulant 20 is typically a mixture of low expansion filler in a liquid prepolymer that can be cured to a solid composite. Lid 60 operates as a heat sink, sometimes called a heat spreader, and is commonly made of a thermal conductivity material such as copper for heat dissipation in packages. Lid 60 is also known as an integrated heat spreader (IHS).

Thermal interface material (TIM) 50 is dispensed between die 40 and lid 60. Providing TIM 50 between die 40 and lid 60, which operates as a heat spreader, improved thermal conductivity of semiconductor package 100 in conventional applications. However, with demands for smaller package sizes and increased device densities requiring higher power densities and higher power consumption in modern devices, even best-in-class TIM such as solder is not effective due to thermal resistance. That is, semiconductor package 100 of the prior art using TIM 50 is not as effective for lessening "hot spots" and for power support required for high-power and high-performance applications.

Figure 2:
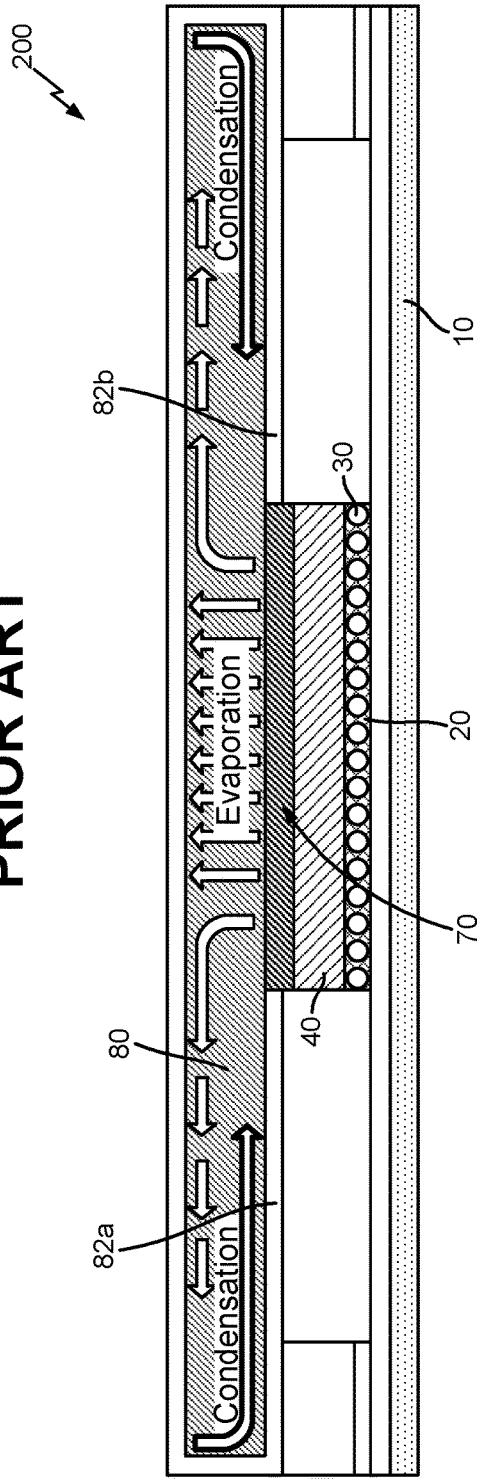
FIG. 2 shows a cross-sectional view of a semiconductor package according to one aspect of the invention.

Referring to FIG. 2, there is shown a cross-sectional view of a semiconductor package 200 of one aspect of the invention. The semiconductor package 200 includes substrate 10, underfill encapsulant 20, solder bumps 30, die 40, a wick 70, and an encapsulation-condensation chamber 80. Die 40 is coupled with substrate 10 using joining members such as solder bumps 30. Substrate 10 may include, for example, epoxy resin made from a weave of glass fibers. Substrate 10 may comprise copper for plastic packages that have lead and copper as heat spreaders, such as Quad Flat No-Lead (QFN). In this configuration, packages where the substrate also operates as a heat spreader. Underfill encapsulant 20 may be filled and sealed in the gap between die 40 and substrate 10. Underfill encapsulant 20 is typically a mixture of low expansion filler in a liquid prepolymer that can be cured to a solid composite. In one aspect, wick 70 is directly deposited on die 40. Wick 70 may comprise copper, aluminum, and/or any high conductive metal. Wick 70 may be in the form of grooves, sintered powder, screen mesh, or bundles of fiber. Wick 70 may have a thickness of about 40 µm to about 100 µm. It should be noted that thickness of wick 70 can be varied and optimized depending on design parameters such as power, power density, and surface area. According to one aspect, wick 70 is mated with encapsulation-condensation chamber 80 and substantially merged along bottom lips 82a and 82b of encapsulation-condensation chamber 80 providing a sealed chamber. By directly depositing wick 70 over die 40 and integrating wick 70 with encapsulation-condensation chamber 80, the embodiment illustrated in FIG. 2 provides significant improvement in package thermal resistance especially for high-power and high-performance applications. With wick 70 deposited on die 40 and integrated in encapsulation-condensation chamber 80, wick 70 effectively operates to evaporate heat from top of die 40, and increases heat flux at the heat source—die 40—for a given temperature rise between the surface and saturated vapor temperature. That is, condensation from the top surface of die 40 can be absorbed by wick 70 and capillary force.

Figure 4:
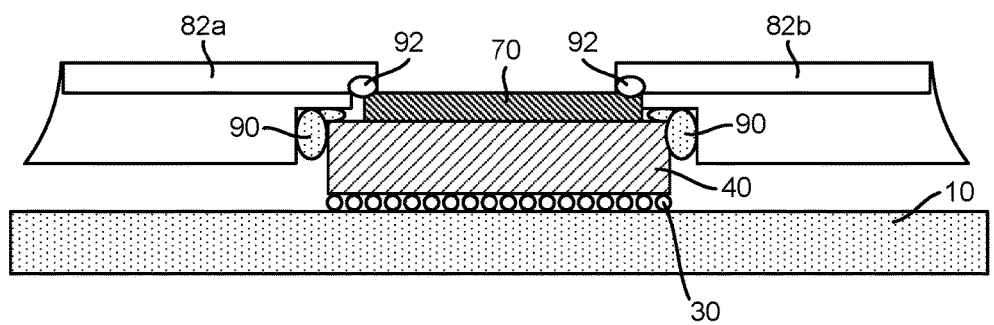
FIG. 4 shows a cross-sectional view of a semiconductor package according to another aspect of the invention.
Figure 5:
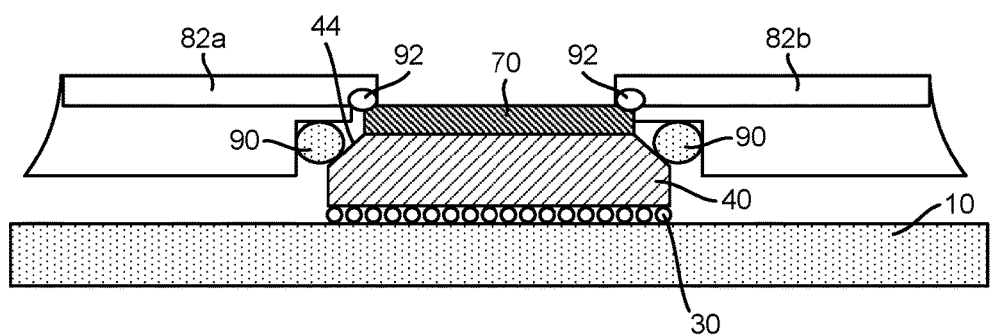
FIG. 5 shows a cross-sectional view of a semiconductor package according to another aspect of the invention.

In another aspect, wick 70 may also extend into encapsulation-condensation chamber 80 to help condensed water back to die 40. For example, wick 70 may have a thickness greater than bottom lips 82a and 82b such that when wick 70 is mated with encapsulation-condensation chamber 80, part of wick 70 extends into or within encapsulation-condensation chamber 80. In yet another aspect as shown in FIG. 4, bottom lips 82a and 82b of encapsulation-condensation chamber 80 are mated with a top surrounding edge of wick 70. The top surrounding edge of wick 70 having an overlapping area 92 with bottom lips 82a and 82b. The overlapping area having a width of about 100 µm to about 150 µm. In yet another aspect, as shown in FIG. 5, wick 70 is deposited over die 40 having chamfered/beveled edge 44 for seals 90 as further described below.

Referring back to FIG. 2, encapsulation-condensation chamber 80 may further include fins to operate as an integrated heatsink solution. Encapsulation-condensation chamber 80 may include freon, water, alcohol or a like liquid being capable of vaporizing to disperse heat away from wick 70 and die 40. Different cooling fluids can also be used depending upon the application and density of electronic devices in a given die 40.

Figure 3A:
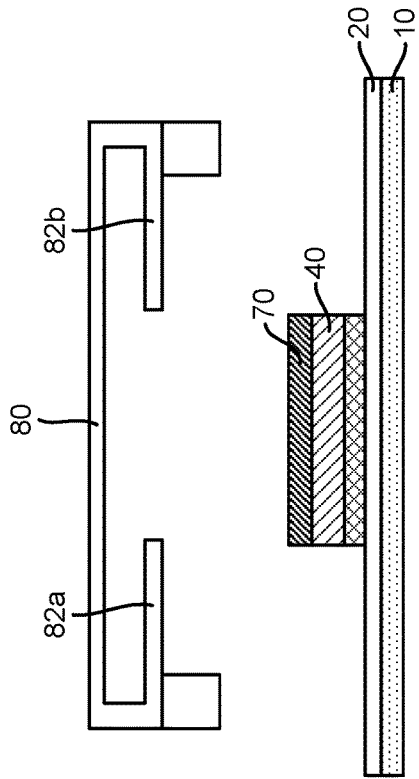
FIGS. 3a-3d show a process of manufacturing a semiconductor package according to one aspect of the invention.
Figure 3B:
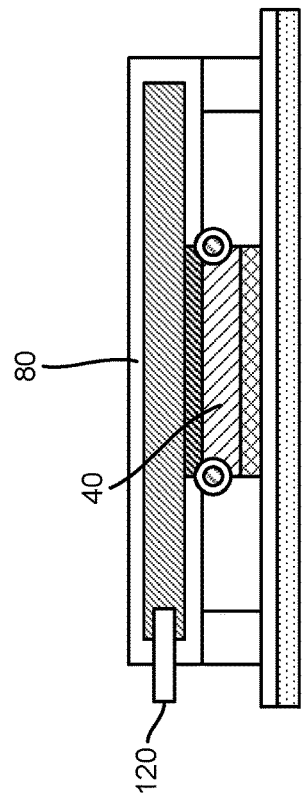
Figure 3C:
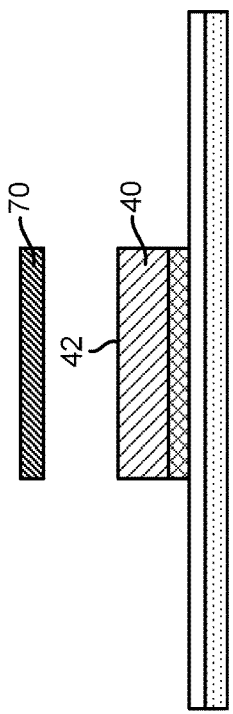
Figure 3D:
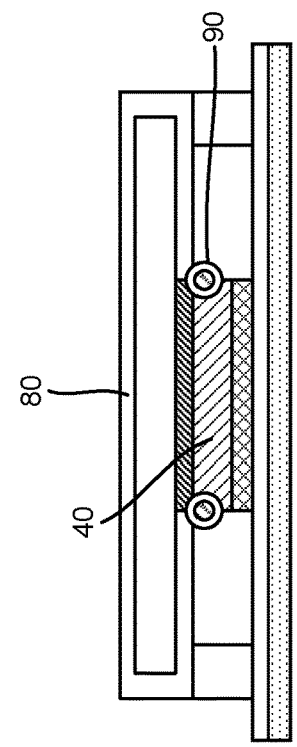

Referring to FIGS. 3a-3d, there is shown a process of manufacturing a semiconductor package 300 in accordance to one aspect of the invention. First, wick 70 is deposited on die surface 42 as shown in FIG. 3a. Bonding between die 40 and wick 70 can be done by soldering at low temperature. Wick 70 may comprise copper, aluminum, and/or any high conductive metal. Wick 70 may be in the form of grooves, sintered powder, screen mesh, or bundles of fiber. Wick 70 may have a thickness of about 40 µm to about 100 µm. For example, bonding between wick 70 and die surface 42 can be done by soldering after metal layer deposition or sputtering on die surface 42. For aluminum wick, a metal/silver based epoxy may be used for bonding with die surface 42. In addition, bonding between wick 70 and surface 42 can also be done when the bottom surface of die 40 is attached through soldering especially if the encapsulation-condensation chamber 80 is made of copper. Another way of attaching the encapsulation-condensation chamber 80 to die 40 is through rubberized epoxy that seals the chamber. Referring to FIG. 3b, encapsulation-condensation chamber 80 with a hollowed bottom portion is mated with die 40 and wick 70 such that wick 70 substantially merges with bottom lips 82a and 82b of encapsulation-condensation chamber 80 forming a sealed chamber. Wick 70 remains on top of die 40. As explained above, wick 70 may also be extend into encapsulation-condensation chamber 80 to help condensed water back to die 40. For example, wick 70 may have a thickness greater than bottom lips 82a and 82b such that when wick 70 is mated with encapsulation-condensation chamber 80, part of wick 70 extends into or within encapsulation-condensation chamber 80. Encapsulation-condensation chamber 80 is placed on top of substrate 10 and underfill encapsulant 20 to form an integrated solution. Referring to FIG. 3c, die 40 is then sealed with encapsulation-condensation chamber 80 using, for example, seals 90. This is done to prevent leakage from chamber 80. It is preferable that no air and/or gas escape from encapsulation-condensation chamber. Seals 90 may be adhesive or solder seals. Adhesive seals may be based on epoxy compounds such as 3M brand epoxy Scotch-Weld 2216 B/A. Seals 90 may include at least one of copper, tin, or indium based solders. If solders seals are used, then the solder seal area is deposited using sputtering or evaporation methods with at least one of titanium, tungsten, or gold layer of about 100 nm. In FIG. 3d, fluid 120 is injected into encapsulation-condensation chamber 80 to provide heat dissipation for high-power and high-performance packages. Encapsulation-condensation chamber 80 may include freon, water, alcohol or a like liquid being capable of vaporizing to disperse heat away from wick 70 and die 40. Different cooling fluids can also be used depending upon the application and density of the electronic devices in a given die 40. Condensation/evaporation chamber 80 may be pressurized and/or tuned to the environment. Is should be noted that the type, size, and/or fluid used for condensation/evaporation chamber 80 may vary depending on environment, design, temperature, pressure, etc.

Table 1 illustrates improvements in package thermal resistance of the TIM-less package of the invention as compared to TIM packages of the prior art. Table 1 shows results of the 3 packages: lid (heat spreader but not evaporation-condensation chamber type) with TIM1 of the prior art (line 1); evaporation-condensation chamber type lid with TIM1 (line 2); and TIM-less evaporation-condensation chamber lid of the invention (line 3). At the same ambient temperature of 50° C., it can be seen that $R_{jc}$, $R_{ja}$, and power support (i.e., performance gain) significantly improved for the "TIM-less evaporation-condensation chamber lid" as compared with the $R_{jc}$, $R_{ja}$, and power support of either the "lid with TIM1" or the "evaporation-condensation chamber type lid with TIM1". For example, the power support (performance gain) for the lid with TIM1 is only 152 W while it more than doubled for the TIM-less evaporation-condensation chamber lid of the invention at 321 W.

TABLE 1

| | Sim description | Package | TIM1 | Total power | Tj, max | Tcase | Delta across die | Rjc (C/W) | Rja (C/W) | Power support @ 50 C. ambient |
|---|---|---|---|---|---|---|---|---|---|---|
| 1 | Original | Amberwing server | Poly | 150 | 97.5 | 78.4 | ~15 C. | 0.127 | 0.297 | 152 |
| 2 | TIM1 + VC lid | Amberwing server | Poly | 150 | 87.5 | 69.6 | ~10 C. | 0.119 | 0.230 | 196 |
| 3 | TIM1-less VC lid | Amberwing server | Poly | 150 | 74 | 68.99 | ~2 C. | 0.033 | 0.140 | 321 |

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A package, comprising:
    a substrate;
    a die coupled to the substrate;
    a wick deposited on the die; and
    an evaporation-condensation chamber having a hollowed enclosure, two bottom lips, and an opening, wherein the wick integrates into the opening by mating with the two bottom lips and forming a sealed chamber.

2. The package of claim 1, further comprising:
    solder bumps between the substrate and the die providing electrical coupling between the substrate and the die.

3. The package of claim 1, wherein the substrate is organic and/or ceramic.

4. The package of claim 3, wherein the substrate operates as a heat spreader.

5. The package of claim 1, further comprising:
    encapsulant on the substrate for sealing the die and the substrate.

6. The package of claim 1, wherein the substrate comprises at least one of epoxy resin or copper, and wherein the substrate operates as a substrate carrier and a heat spreader.

7. The package of claim 1, wherein the wick comprises at least one of copper, aluminum, or any high conductive metal.

8. The package of claim 1, wherein the wick has a thickness of about 70 μm to about 100 μm.

9. The package of claim 1, wherein the evaporation-condensation chamber further comprises fins to dissipate heat.

10. The package of claim 1, wherein the evaporation-condensation chamber includes a cooling fluid capable of dispersing heat away from the wick and the die.

11. The package of claim 10, wherein the cooling fluid is selected based on the application and/or density of electronic devices in the die.

12. The package of claim 1, wherein the cooling fluid includes at least one of freon, water, or alcohol.

13. Method of forming a package, comprising:
    coupling a die to a substrate;
    depositing a wick on the die;

mating the wick with an evaporation-condensation chamber having a hollowed enclosure, two bottom lips, and an opening, wherein the mating integrates the wick into the opening and attaches with the two bottom lips forming a sealed chamber.

14. Method of claim 13, further comprising:
soldering the die to the chamber.

15. Method of claim 14, wherein the soldering is at least one of copper, tin, or indium based soldering.

16. Method of claim 13, further comprising:
forming solder bumps between the substrate and the die providing electrical coupling between the substrate and the die.

17. Method of claim 13, further comprising:
forming encapsulant on the substrate for sealing in gap between the die and the substrate.

18. Method of claim 13, wherein the wick comprises at least one of copper, aluminum, or any high conductive metal.

19. Method of claim 13, wherein the wick is in the form of any one of grooves, sintered powder, screen mesh, or bundles of fiber.

20. Method of claim 13, wherein the wick has a thickness of about 70 μm to about 100 μm.

21. Method of claim 13, wherein the depositing of the wick on the die further comprises soldering copper fibers or wires onto a top surface of the die.

22. Method of claim 13, further comprising:
injecting the evaporation-condensation chamber with a fluid to provide heat dissipation for the package.

23. Method of claim 22, wherein the evaporation-condensation chamber includes a cooling fluid capable of dispersing heat away from the wick and the die.

24. Method of claim 23, wherein the cooling fluid is selected based on the application and/or density of electronic devices in the die.

25. Method of claim 24, wherein the evaporation-condensation chamber is pressurized and/or tuned to the environment.

\* \* \* \* \*